(12) United States Patent
Gianella et al.

(10) Patent No.: US 11,293,861 B2
(45) Date of Patent: Apr. 5, 2022

(54) DUAL-COMB SPECTROSCOPY

(71) Applicants: IRsweep AG, Stäfa (CH); EMPA EIDGENÖSSISCHE MATERIAL PRÜFUNGS—UND FORSCHUNGSANSTALT, Dübendorf (CH)

(72) Inventors: Michele Gianella, Dübendorf (CH); Andreas Hugi, Zurich (CH); Markus Mangold, Zurich (CH); Akshay Nataraj, Zurich (CH); Lukas Emmenegger, Dübendorf (CH)

(73) Assignees: IRsweep AG, Stafa (CH); EMPA EIDGENÖSSISCHE MATERIAL PRÜFUNGS—UND FORSCHUNGSANSTALT, Dubendorf (CH)

( * ) Notice: Subject to any disclaimer, the term of this patent is extended or adjusted under 35 U.S.C. 154(b) by 0 days.

(21) Appl. No.: 17/000,924

(22) Filed: Aug. 24, 2020

(65) Prior Publication Data
US 2021/0063306 A1 Mar. 4, 2021

(30) Foreign Application Priority Data

Aug. 26, 2019 (GB) ..................... 1912228

(51) Int. Cl.
*G01J 3/45* (2006.01)
*G01N 21/39* (2006.01)
(Continued)

(52) U.S. Cl.
CPC ................ *G01N 21/39* (2013.01); *G01J 3/45* (2013.01); *G01N 2201/06113* (2013.01); *H01S 5/3402* (2013.01); *H01S 5/4012* (2013.01)

(58) Field of Classification Search
CPC . G01N 21/39; G01N 2201/06113; G01J 3/45; G01J 2003/423; G01J 3/42;
(Continued)

(56) References Cited

U.S. PATENT DOCUMENTS

2017/0201328 A1* 7/2017 Hugi ..................... G01J 3/433
2019/0041267 A1 2/2019 Burghoff et al.
(Continued)

FOREIGN PATENT DOCUMENTS

WO 2015/193282 A1 12/2015
WO 2018/102915 A1 6/2018
WO 2019/110650 A1 6/2019

OTHER PUBLICATIONS

Villares, et al., "Dual Comb spectroscopy based on quantum-cascade-laser frequency combs," Institute for Quantum Electronics, Macmillan Publishers Limited, pp. 1-9, Zurich, Switzerland, 2014.

*Primary Examiner* — Jonathan M Hansen
(74) *Attorney, Agent, or Firm* — Renner, Otto, Boisselle & Sklar, LLP

(57) ABSTRACT

A dual-comb spectrometer 5 with two lasers 10, 12 serving as a local oscillator and an interrogator. The lasers output light beams with respective frequency combs C1, C2 of defined free spectral range, FSR. A detector 30 can detect heterodyne mixing of the combined beams to detect an RF frequency comb C3. Respective control signals are supplied to the lasers which have functional forms configured to cause the frequencies of the lasers' frequency combs C1, C2 to tune over a defined fraction of their FSR. This enables a reduction of the effective spectral sampling period by a factor equal to the ratio of the FSR to the spectral resolution of the spectrometer, which will typically be several orders of magnitude, so that the spectral sampling period can be
(Continued)

reduced from the GHz to the MHz range, which in turn enables a gapless spectrum to be obtained in a short time.

13 Claims, 9 Drawing Sheets

(51) Int. Cl.
*H01S 5/34* (2006.01)
*H01S 5/40* (2006.01)

(58) Field of Classification Search
CPC ........ G01J 2003/102; G01J 3/10; G01J 3/433; G01J 2003/4332; H01S 5/3402; H01S 5/4012
See application file for complete search history.

(56) References Cited

U.S. PATENT DOCUMENTS

| | | | |
|---|---|---|---|
| 2021/0063243 A1* | 3/2021 | Anandarajah | G01J 3/453 |
| 2021/0080324 A1* | 3/2021 | Rieker | G01J 3/0218 |

* cited by examiner

DUAL-COMB SPECTROSCOPY

This application claims priority to GB Patent Application No. 1912228.2 filed on Aug. 26, 2019, which is hereby incorporated herein by reference.

BACKGROUND OF THE INVENTION

The invention relates to dual-comb spectrometers and methods of dual-comb spectroscopy (DCS).

In DCS, an interrogating comb light beam is used to probe the sample, while a local oscillator comb light beam, with a slightly different comb spacing, is used to produce an interferogram which arises from the multi-heterodyning of the comb lines from the two beams. The discrete Fourier transform (DFT) of the interferogram, referred to as the multi-heterodyne beat note signal, MHBNS, consists of a number of evenly spaced narrow-band components (beat notes), each of which carries the information about magnitude and phase of the two optical comb lines that generated it.

WO2015193282A1 discloses a dual-comb spectrometer based on two free-running quantum cascade lasers (QCLs). Typical QCL sources emit at wavelengths around 3-12 micrometers, i.e. in the mid-infrared region (3-8 micrometers) and part of the long infrared region (8-15 micrometers). A first QCL serves as the local oscillator and outputs a first light signal containing a frequency comb consisting of a finite series of discrete frequencies separated by a first spacing. A second QCL, serving as the interrogator, outputs a second light signal containing frequency comb consisting of a finite series of discrete frequencies separated by a second spacing. Heterodyne mixing of the first and second light signals generates a third frequency comb having a third spacing equal to the difference between the first and second spacings. A sample detector is arranged to receive a combined light signal from superimposing the first and second light signals after at least the second light signal has traversed a sample space. A normalizing detector is arranged to receive a combined light signal from superimposing the first and second light signals, neither of which has traversed the sample space. The signal from the normalizing detector can be used to normalize the signal from the sample detector, e.g. by dividing the amplitudes of the beat notes measured in the sample detector signal by the amplitudes of the beat notes measured in the normalizing detector signal.

Operation of a dual-comb spectrometer that has QCL sources is unproblematic for detecting broadband absorptions, such as from solids, but less well suited to narrowband absorptions, such as from gases. This is because of the relatively coarse spacing, i.e. relatively large free spectral range (FSR) of QCLs, e.g. typically 5-15 GHz, which results in a correspondingly large spectral point spacing. A narrow absorption line can therefore easily be missed unless the measurement is pre-designed to ensure that one or more of the lines of the interrogating comb are placed at frequencies matched to those of particular absorption lines or set of absorption lines characteristic of a particular molecule being sought.

In principle, this limitation can be overcome by tuning the frequency combs of the local oscillator and interrogating beams over the FSR to fill in the gaps that would otherwise exist absent such tuning. However, data acquisition with such tuning may be relatively slow with the methods proposed in WO2015193282A1.

SUMMARY OF THE INVENTION

According to a first aspect of the invention there is provided a dual-comb spectrometer comprising:

a first semiconductor laser source, serving as a local oscillator, operable to output a first light signal containing a first frequency comb consisting of a finite series of discrete frequencies separated by a first spacing defined as a first spectral range;

a second semiconductor laser source, serving as an interrogator, operable to output a second light signal containing a second frequency comb consisting of a finite series of discrete frequencies separated by a second spacing defined as a second spectral range;

a sample detector operable to output a measurement signal and arranged to receive a combined light signal from superimposing the first and second light signals after at least the second light signal has traversed a sample space, the sample detector having a detection bandwidth that covers a frequency range corresponding to a third frequency comb that is detected by the sample detector as the measurement signal as a result of heterodyne mixing of the first and second light signals, the third frequency comb having a third spacing equal to the difference between the first and second spacings;

a data acquisition module arranged to collect a dataset of data points from the sample detector over a scan period; and a controller configured to output first and second control signals to the first and second laser sources, the first and second control signals following first and second functional forms over the scan period to cause the frequencies of the first and second frequency combs to tune over a defined fraction of their free spectral ranges.

The tuning may be continuous, e.g. smoothly varying, or quasi-continuous, e.g. stepped or incremented. The tuning may be monotonic so that during the time interval over which a scan takes place the first and second control signals ramp up or ramp down.

It is noted that the FSRs of the first and second laser sources can be treated as equal, since although they need to be different to generate the heterodyne mixing, the difference is extremely small—typically 3 or 4 orders of magnitude smaller than the optical frequencies of the laser sources. We therefore often refer to "the" FSR in the following. The tuning provided by the first and second control signals during the scan period enables a reduction of the effective spectral sampling period by a factor equal to the ratio of the FSR of the first and second laser sources, i.e. their native spectral sampling period, to the spectral resolution (i.e. detection limit) of the spectrometer. In our experiments, this ratio was around ten thousand leading to a reduction of the spectral sampling period from 9.8 GHz to ca. 1 MHz. In turn, this enables a spectrum to be obtained in a very short time, e.g. 120 ms. If the defined fraction of the FSR scanned by the first and second control signals is more than unity, then the spectrum is gapless and so even the narrowest line features will be detected.

It is possible to configure the first and second control signals to ensure the frequency range of the third frequency comb is kept within the bandwidth of the sample detector during the scan period.

In some embodiments, the controller is configured to receive a radio frequency (RF) signal indicative of a frequency of at least one tooth of the third frequency comb, wherein at least one of the first and second control signals is adjusted in a feedback loop responsive to the RF signal to ensure the frequency range of the third frequency comb is kept within the bandwidth of the sample detector during the scan period. In some embodiments, the RF signal is derived from the combined light signal received by the sample or normalizing detectors. In other embodiments, an additional detector is arranged to receive a separate component of the combined light signal, and the RF signal is derived from the signal collected by the additional detector. The RF signal may be obtained by a filter, which has a bandwidth designed to pass a single beat-note i.e. a single tooth of the third frequency comb. This filter can be an electrical filter or optical filter. The feedback loop can be controlled to hold the frequency range of the third frequency comb constant.

The controller can be configured to apply the first and second control signals to scan repeatedly over multiple ones of the scan period to collect multiple datasets. The controller can also be configured to apply the first and second control signals once in response to a trigger to scan once over the scan period to collect a single dataset.

The defined fraction of the free spectral range can be one or more than one in order to provide gapless coverage. For example, if the fraction is somewhat more than one, e.g. 5/4, there is significant overlap between signal fragments collected from each neighboring comb tooth pair. It may sometimes be useful to have a fraction of 2 or more to cover several FSRs, since this will allow averaging out of uneven signal-to-noise ratios from different scans, since signal-to-noise ratio depends on signal strength of individual beat-notes. The defined fraction of the free spectral range can also be less than one, e.g. 1/5, since a smaller range may well be sufficient to scan the frequency space around a known molecular resonance, when the resonance has a bandwidth substantially smaller than the FSR.

In some embodiments, the functional forms of the control signals are linear over the scan period. In other embodiments, one or both of the functional forms may deviate from linear, i.e. be non-linear. The functional forms may be rising functions or falling functions. If periodic control signals are applied, the first and second control signals may be generally triangular in shape, e.g. sawtooth shaped, but may deviate from constant slopes, i.e. deviate from linear, in the rising and falling flanks of the signals.

In some embodiments, the first and second control signals are voltage signals that are input to first and second current drivers, which translate the first and second control signals into a modulation of a first and second drive currents applied to the first and second laser sources. This will likely be the most common implementation, but there are other ways to impose the functional forms of the control signals onto the laser sources, as discussed below in the detailed description, e.g. using temperature changes.

The spectrometer may further comprise a frequency demodulator arranged to extract an error signal from the measurement signal, the error signal being fed back to the controller, the controller being configured to determine a correction signal from the error signal in a control loop to at least one of the first and second laser sources derived from the error signal so as to lock the first laser source to the second laser source in a master-slave configuration. The controller can be connected to apply the correction signal as a modulation to the first and second functional forms it uses to generate the first and second control signals, providing a slow feedback loop. Alternatively, the controller can be connected to apply the correction signal as a modulation to the first and second control signals, providing a fast feedback loop.

The spectrometer may further comprise a first RF generator operable to generate a first reference signal at a first RF frequency that is matched to the first free spectral range, the first RF generator being connected to inject the first reference signal into the cavity of the first laser source to lock the first free spectral range to the first RF frequency. Similarly, the spectrometer may further comprise a second RF generator operable to generate a second reference signal at a second RF frequency that is matched to the second free spectral range, the second RF generator being connected to inject the second reference signal into the cavity of the second laser source to lock the second free spectral range to the second RF frequency.

In some embodiments, the first and/or second RF frequencies can be kept constant throughout the scan period. In other embodiments, the first and/or second RF frequencies are changed during the scan period, since otherwise the first and/or second free spectral ranges of the first and second laser sources would drift outside the locking range of the first and/or second reference frequencies.

According to a first aspect of the invention there is provided a method of operating a dual-comb spectrometer comprising:

arranging a sample in a sample space;

outputting with a first semiconductor laser source, serving as a local oscillator, a first light signal containing a first frequency comb consisting of a finite series of discrete frequencies separated by a first spacing defined as a first spectral range;

outputting with a second semiconductor laser source, serving as an interrogator, operable to a second light signal containing a second frequency comb consisting of a finite series of discrete frequencies separated by a second spacing defined as a second spectral range;

measuring with a sample detector a measurement signal from a combined light signal formed from superimposing the first and second light signals after at least the second light signal has traversed the sample space, the sample detector having a detection bandwidth that covers a frequency range corresponding to a third frequency comb that is detected by the sample detector as the measurement signal as a result of heterodyne mixing of the first and second light signals, the third frequency comb having a third spacing equal to the difference between the first and second spacings;

applying first and second control signals to the first and second laser sources with a controller, the first and second control signals following first and second functional forms over a scan period to cause the frequencies of the first and second frequency combs to tune over a defined fraction of their free spectral ranges; and collecting a dataset of data points from the sample detector over the scan period with a data acquisition module.

In addition to a sample detector, it is useful to also have a normalizing detector. The normalizing detector, like the sample detector, has a detection bandwidth covering the third frequency comb. The normalizing detector is arranged to receive a combined light signal from superimposing the first and second light signals, neither of which has traversed the sample space. The signal from the normalizing detector can be used to normalize the signal from the sample detector, e.g. by dividing the amplitudes of the beat notes measured in the sample detector signal by the amplitudes of the beat notes measured in the normalizing detector signal. The data acquisition module is arranged also to collect a dataset of data points from the normalizing detector over a scan period, which can then be compared with the corresponding dataset from the sample detector.

In some embodiments, the first and second laser sources are free running. By free running we mean that the lasers are allowed to lase optically independently of each other, rather than being locked together, e.g. by phase locking. In other embodiments, the first and second laser sources may be locked, e.g. in a master-slave relationship.

The drive currents provided to the two lasers are coordinated so that the beat notes generated by the RF intermixing frequencies of the first and second frequency combs, i.e. the frequencies of the third frequency comb, lie within the bandwidth of the sample detector and, if present, the normalizing detector.

In one configuration, the combined light signal is a combination of the first and second light signals after the second light signal has traversed the sample space and the first light signal has not. With this configuration both amplitude and phase of the beat notes are obtained. In another configuration, the combined light signal is a combination of the first and second light signals after both the first and the second light signals have traversed the sample space. With this configuration only amplitude information is obtained.

The first and second control signals may be applied to modulate the first and second drive currents and thereby to tune the first and second frequency combs. Instead or as well as the above, the first and second control signals, or first and second components thereof, may be applied to modulate the temperature of the first and second laser sources via first and second heaters arranged in thermal communication with the first and second laser sources. Other tuning possibilities may also be available based on any parameter that can be varied so as to modulate refractive index or temperature of the sources, e.g. broadband illumination of a part of the source.

The semiconductor laser sources may be quantum cascade lasers (QCLs) based on transitions between subbands, or interband cascade lasers (ICLs) based on transitions between bands.

BRIEF DESCRIPTION OF THE DRAWINGS

This invention will now be further described, by way of example only, with reference to the accompanying drawings.

DETAILED DESCRIPTION

Definitions

Frequency comb: a form of laser output consisting of a series of discrete, equally spaced frequencies, referred to as teeth.

Free spectral range (FSR): the spacing in optical frequency between two neighboring comb teeth. In a dual-comb spectrometer, the respective FSRs of the local oscillator and interrogation will be almost the same, i.e. only marginally different, perhaps differing only by ⅕₀₀₀. Hence, in DCS we usually refer to "the" FSR even though there are two marginally different FSRs.

Beat notes: a term used to describe the heterodyne frequencies generated by beating of the local oscillator and interrogation beams in an optical heterodyne system as a consequence of the difference in their FSRs.

Spectral sampling period: spectral distance between adjacent measurement points, sometimes referred to as point spacing.

Spectral resolution: minimum resolvable spectral distance in frequency or wavelength between two spectral lines.

Scan: a coordinated joint tuning of the local oscillator and interrogation frequency combs to tune their emission spectra over a defined fraction of the free spectral range.

DESCRIPTION OF FIGURES

Figure 1:
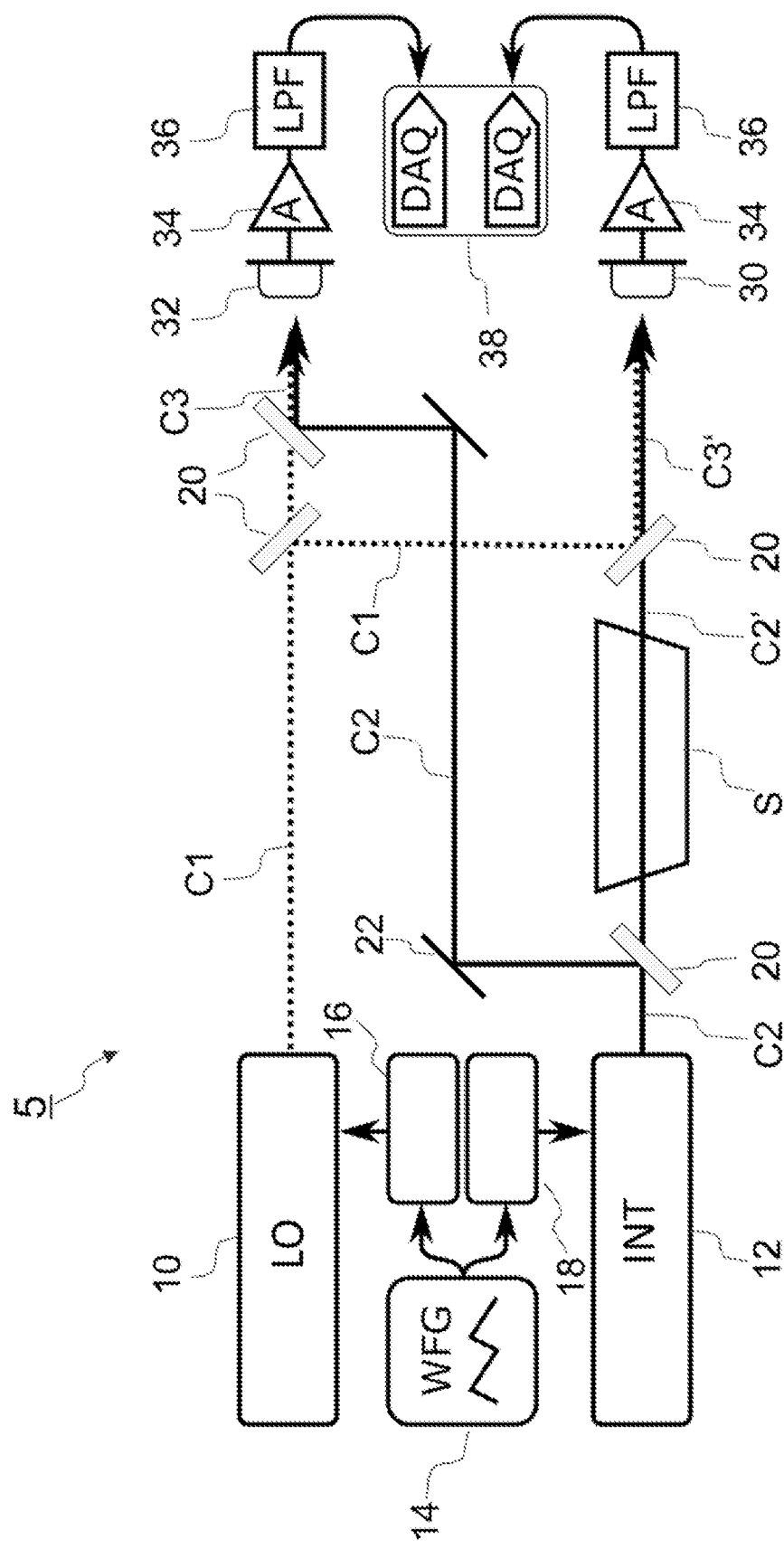
FIG. 1 is a schematic drawing of a dual-comb spectrometer according to a first embodiment in which only the interrogating comb is transmitted through the sample.

FIG. 1 is a schematic drawing of a dual-comb spectrometer 5 in a configuration in which only the interrogating comb beam is transmitted through the sample S. This approach measures both the amplitude and phase response of the sample, and so can be referred to as a phase-sensitive configuration.

The dual-comb spectrometer 5 is based around a pair of laser sources, namely a QCL 10 serving as a local oscillator and a QCL 12 serving as the interrogator. The first and second laser sources 10, 12 are free running in the example configuration shown. By free running we mean that the lasers are allowed to lase optically independently of each other, rather than being locked, e.g. by phase locking. The two QCLs 10, 12 generate respective light signals containing respective frequency combs C1 and C2, each having frequencies consisting of a finite series of discrete frequencies. Combining the first and second light beams results in the photocurrent output by a photodetector receiving such a combined beam generating a superposition of sinusoidal oscillations in the photocurrent, with a set of frequencies evenly spaced by the difference between the first and second spacings, representing a third frequency comb which is shifted several orders of magnitude to longer frequencies relative to the first and second frequency combs. We refer to the frequency range of the third comb as lying in the RF, following normal usage, although the frequency range may not in all cases be in the radio frequency range (i.e. 20 kHz-300 GHz) as would be understood by an RF engineer.

The QCLs 10, 12 are driven by respective current drivers 16, 18 for supplying suitable drive currents to the QCLs. The laser drive currents may beneficially be low-pass filtered (e.g. cut-off below 100 Hz) although low-pass filtering is not necessary in all cases. For example, in our prototype system, each laser emits around 300-400 mW of average power at 1.1 A (typical drive current). The current drivers 16, 18 are in turn controlled by respective voltage control signals supplied by a waveform generator (WFG) 14 which defines first and second functions for impressing on the voltage control signals. The functions each have a rising portion designed to cause the two QCLs 10, 12 to be tuned so as to scan a sample over a pre-determined RF range. The voltage functions output by the WFG are then applied to generate corresponding drive current functions to drive the QCLs 10 and 12. The functions can be applied periodically to scan repeatedly.

The output beams from QCLs 10 & 12 are split and guided respectively by suitably arranged beam splitters 20 and plane mirrors 22 so that the interrogating frequency comb C2 traverses the sample S which attenuates its amplitude through absorption and also induces a phase shift. We label the interrogating frequency comb after passage through the sample as C2'. The interrogating frequency comb C2" and the local oscillator frequency comb C1 are detected as a combined comb C3' at a photodetector 30, referred to as the sample detector. A reference combined comb C3 is also detected at a further photodetector 32, referred to as the normalizing detector, in order to provide a basis for normalizing the combined comb signal C3'. The reference, normalizing signal is based on combined detection of the local oscillator comb C1 and the interrogating frequency comb C2, where the local oscillator and interrogating beams are directed and combined (without traversing the sample) with the aid of suitably arranged beam splitters 20 and plane mirrors 22. It will be appreciated that equivalent optical fiber components could be used instead for manipulating the beams through the sample and onto both the sample detector 30 and normalizing detector 32.

The signals picked up by the photodetectors 30, 32 are amplified by respective amplifiers 34 which are serially connected to respective low-pass filters (LPFs) 36 which serve to exclude frequencies from outside the range of the third frequency comb C3 and on to the inputs of respective digital-to-analogue converters (DAQs) 38 which digitize the signals and supply them to the inputs of digital electronics provided for data acquisition and logging, e.g. in a computer that may also be used for controlling the WFG 14 and any other components that either require control inputs or provide sensor signals relevant for the QCLs, e.g. to keep the QCLs at a stable temperature. For example, the QCL lasers 10, 12 may be housed in respective water-cooled enclosures with a thermoelectric element in each housing to set and maintain the laser temperature at 25° C. In one example, the LPFs 36 have a pass-band of 50-1050 MHz. In one example, the DAQs 38 are 14-bit and operated with a sampling rate of 2 Gsamples/s. The QCL output powers are chosen so that the power reaching the photodetectors 30, 32 is within the linear response range of the photodetectors 30, 32. The signal collected by the normalizing photodetector 32 serves to cancel or suppress common mode fluctuations between the free running QCLs due to power and frequency fluctuations.

The sample photodetector 30 measures the interferogram C3' of the combs C1, C2' (where comb C2 has been attenuated and phase-shifted to become comb C2' by traversing the sample S), whereas the normalizing photodetector 32 measures the interferogram C3 of the combs C1, C2 (without influence of the sample S).

Figure 2:
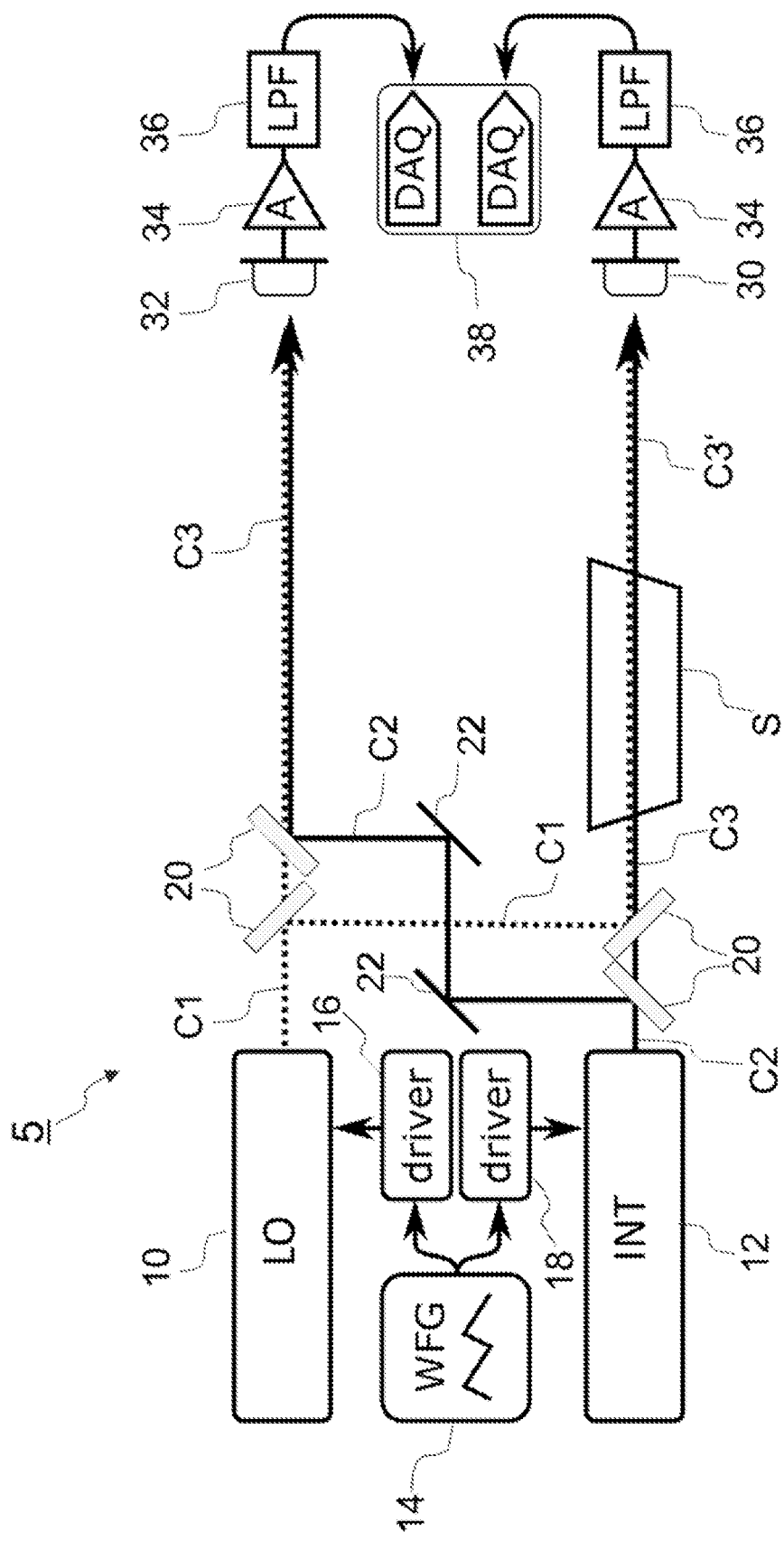
FIG. 2 is a schematic drawing of a dual-comb spectrometer according to a second embodiment in which both the interrogating and local oscillator combs are transmitted through the sample.

FIG. 2 is a schematic drawing of a dual-comb spectrometer 5 in a configuration in which both the interrogating and local oscillator comb beams are transmitted through the sample. This approach measures only the amplitude response of the sample, i.e. its absorption. The elements are the same as for the configuration of FIG. 1 and the same comments and details apply. The configurations only differ in respect of how the comb signals C1, C2 are routed via suitable beam splitters 20 and plane mirrors 22. Namely, in the configuration of FIG. 2, the comb signals C1 and C2 both traverse the sample, so the combined signal C3' only carries amplitude modulation information from the sample and no phase information. The sample photodetector 30 thus measures the interferogram C3' of the combs C1, C2', where combs C1 and C2 have been attenuated and phase-shifted to become combs C1' and C2' by traversing the sample S. The normalizing photodetector 32 measures the interferogram C3 of the combs C1, C2 (without influence of the sample S). The sample S occupies a sample space. The sample S may be held in position using a sample holder.

Figure 3:
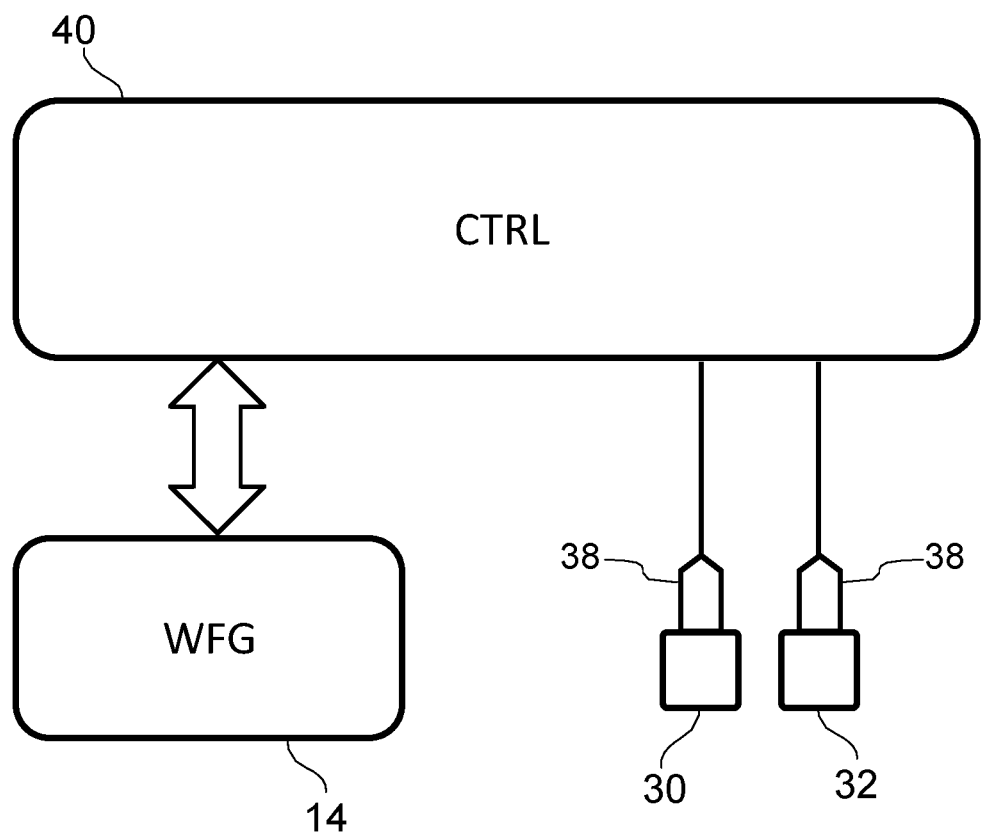
FIG. 3 shows the dual-comb spectrometer of FIG. 1 or 2 in combination with a computer for control and data acquisition.

FIG. 3 shows in functional blocks the dual-comb spectrometer 5 of FIG. 1 or 2 in combination with a computer 40 to provide a controller for control of the spectrometer 5, including the WFG 14, and to provide a data acquisition module for data acquisition. The computer 40 is able to program and actuate the WFG 14 via a suitable bus interface. The computer 40 is also connected to receive and store the digitized data derived from the photodetectors 30, 32 and DAQs 38. After each scan, or batch of scans, the raw digitized data may be written to disk, or otherwise stored in memory, without any initial processing. In one example, there is ca. 1 GByte of data per measurement scan. The control computer & data logger 40 may also contain a graphics processor unit (GPU) or field programmable gate array (FPGA) or a programmable logic array (PLA) for real-time data-processing.

A further refinement to what has been described above is to lock the output of one or both of the lasers 10 and 12 by measuring the RF frequency modulation in the mixed signal detected by detector 30 and/or 32 and then feeding this back as an error signal which is used as a basis for adjusting the drive current of one or both of the lasers 10 and 12. The drive current adjustment could be done directly by adding a small correcting adjustment current to the drive current output by the WFG 14 (fast loop). Alternatively, the drive current adjustment could be done indirectly by inputting the error signal to the WFG 14, the error signal then being used by the WFG 14 to modify the voltage waveform it is applying to generate the drive current (slow loop). The error signal may be generated from the RF signal(s) using a frequency demodulator, such as a phase detector, phase comparator or low pass filter. In addition a lock-in amplifier (analogue or digital) may be used in combination with a frequency demodulator to generate the error signal.

The error signal can be based on a measurement of the drift of one or more of, or potentially all of, the frequencies of either one of, or both of, the combs C3 and C3'. The same FPGA and/or GPU as mentioned above can be used to determine an appropriate drive current correction signal from the error signal. A master-slave configuration is thus provided between the interrogating comb laser source 12 and the local oscillator comb laser source 10.

Figure 4:
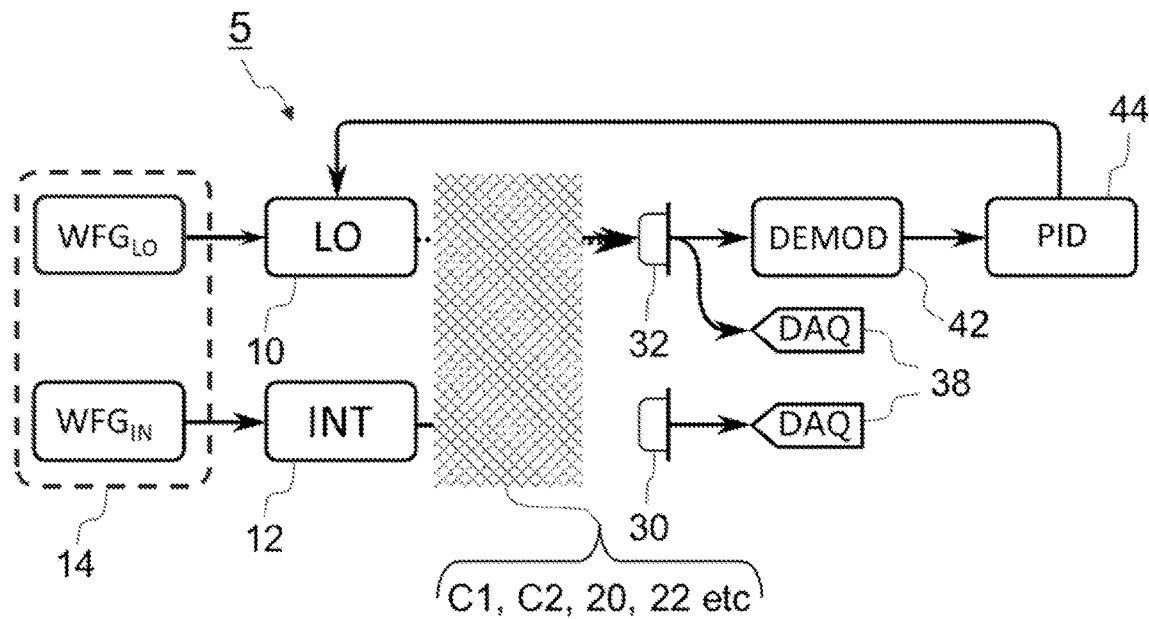
FIG. 4 shows an example fast feedback loop architecture to modify the configuration of either FIG. 1 or FIG. 2 so as to lock the laser outputs in a master-slave configuration.
Figure 5:
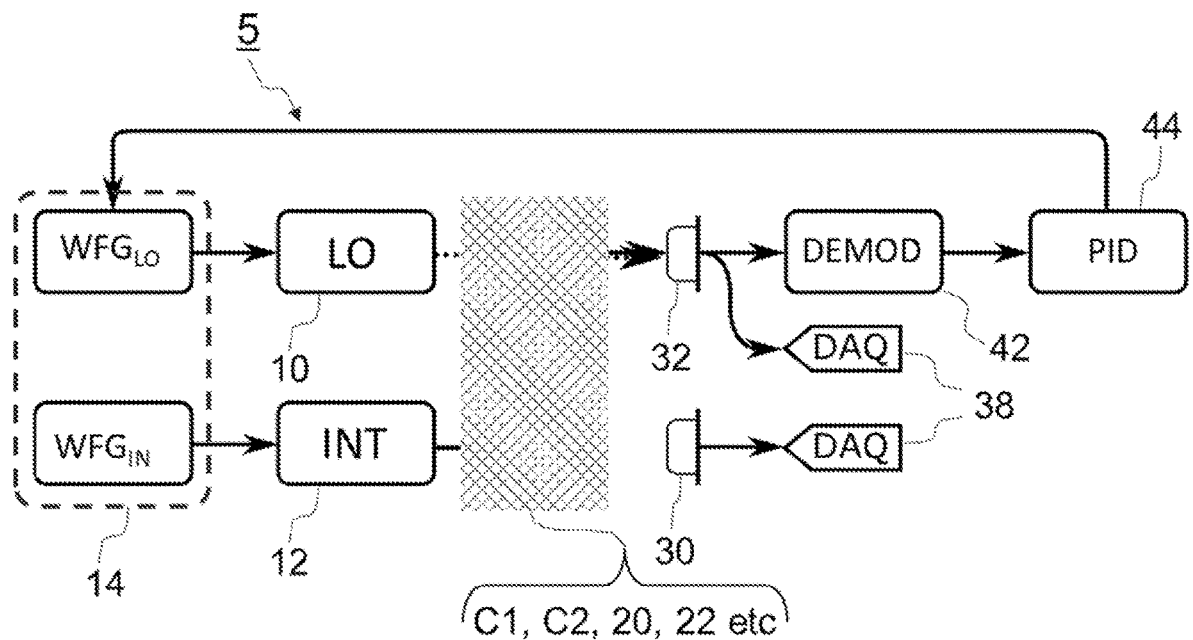
FIG. 5 shows an example slow feedback loop architecture to modify the configuration of either FIG. 1 or FIG. 2 so as to lock the laser outputs in a master-slave configuration.

FIGS. 4 and 5 illustrate example fast loop and slow loop feedback architectures in which the output of the first laser source 10 is locked based on an error signal derived from the signal received at detector 32, thereby providing the above-described master-slave configuration. The illustrations omit some of the detail from FIGS. 1 and 2 when this is not directly relevant for the feedback loop, e.g. the drivers 16, 18, the amplifiers 34 and the filters 36 are omitted from the illustrations. In FIGS. 4 & 5, the waveforms generated for each of the laser sources 10 & 12 by the WFG 14 are each schematically depicted inside the WFG 14 as the boxes labelled $WFG_{LO}$ for local oscillator and $WFG_{IN}$ for interrogating comb. In both examples, the RF signal from the comb C3 measured by detector 32 is used as input to a frequency demodulator 42, and the error signal output from the frequency demodulator 42 is supplied to a PID controller 44 which generates a correction signal that is used to modulate the drive current for the first laser source 10. It is also noted that the feedback schemes shown in FIGS. 4 and 5 could be implemented with any desired sample setup, e.g. as shown in FIG. 1 or FIG. 2 or any other suitable arrangement. The fact that these feedback loop architectures are generic to the optical routing from the lasers to the detectors via the sample is indicated schematically with the cross-hatched box in both FIG. 4 and FIG. 5.

FIG. 4 shows a fast loop implementation using a PID controller 44 to generate a correction signal that is fed back to adjust the laser drive current. The signal C3 and/or C3' of either detector 30, 32 in the reference setup is frequency demodulated by a frequency demodulator 42 to generate an error signal. The frequency demodulation can be performed before or after DAQ, i.e. on the analogue signal or the digitized signal. The former option is illustrated. The frequency demodulated signal generated by a frequency demodulator 42 is fed into a PID controller 44 to generate a correction signal. The correction signal is used to alter the laser drive current (or any other drive parameter used to adjust the frequency output of the device, such as temperature) of the laser source 10. The drive current can be adjusted directly on the laser driver, e.g through an analogue input on a QCL 2000 Wavelength Electronic driver. Another method would be to employ a field effect transistor (FET) after the laser current output to alter the drive current at a fast rate.

FIG. 5 shows a slow loop implementation using a PID controller 44 to generate a correction signal that is fed back to the WFG 14 to adjust the waveform and hence, through the adjusted waveform, adjust the laser drive current. The signal C3 and/or C3' of either detector 30, 32 in the reference setup is frequency demodulated by a frequency demodulator 42 to generate an error signal. The frequency demodulation can be performed on the analogue signal or the digitized signal. The former option is illustrated. The PID controller 44 determines a correction signal from the error signal, which is then output by the PID controller 44 and supplied as an input to the WFG 14, the magnitude of the correction signal then being used to make fine adjustments to the voltage waveform $WFG_{LO}$ that the WFG 14 is generating for the first laser source 10. The corresponding voltage waveform $WFG_{IN}$ generated by the WFG 14 for the second laser source 12 need not be included in the feedback loop (as illustrated). The correction signal output from the PID controller 44 continually or continuously updates the waveform for the laser source 10 to keep the signals at the detectors 30 and 32 within their bandwidths according the method described further below with reference to FIGS. 6 to 8. Slow feedback to the WFG 14 to continually or continuously update the waveform has the advantage that no noise is added, which is a potential limitation of a fast feedback implementation. It is understood that the PID controller 44 can be integrated in a computer platform and be part of the control computer & data logger 40.

In respect of both slow and fast feedback loops, since both detectors will generally be the same, they will have the same bandwidth specifications, so operating the feedback loop based on signal from only one of the detectors will in many cases be adequate to keep the signal within the bandwith of both detectors.

Figure 6:
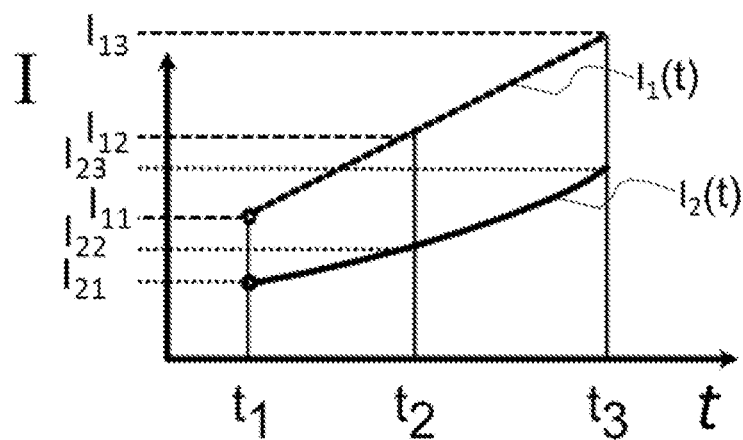
FIG. 6 shows two control signals in the form of two laser drive currents which ramp in tandem to scan over a predetermined fraction of the lasers' free spectral range (FSR).
Figure 7:
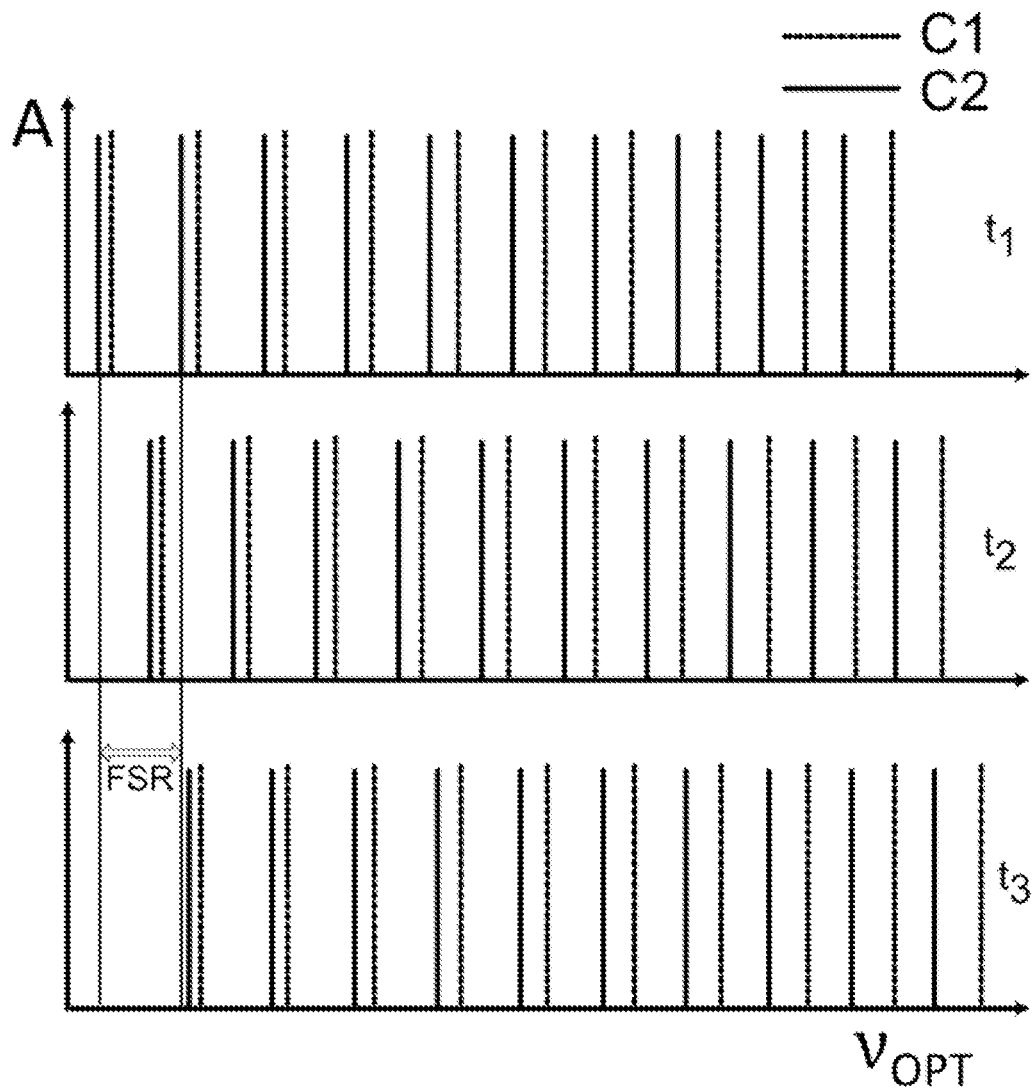
FIG. 7 shows three schematic graphs of amplitude, A, versus optical frequency, vopT, each showing the local oscillator and interrogating frequency combs C1 and C2 at the start, middle and end of a scan at respective times t1, t2 and t3 to cover slightly more than one FSR.
Figure 8:
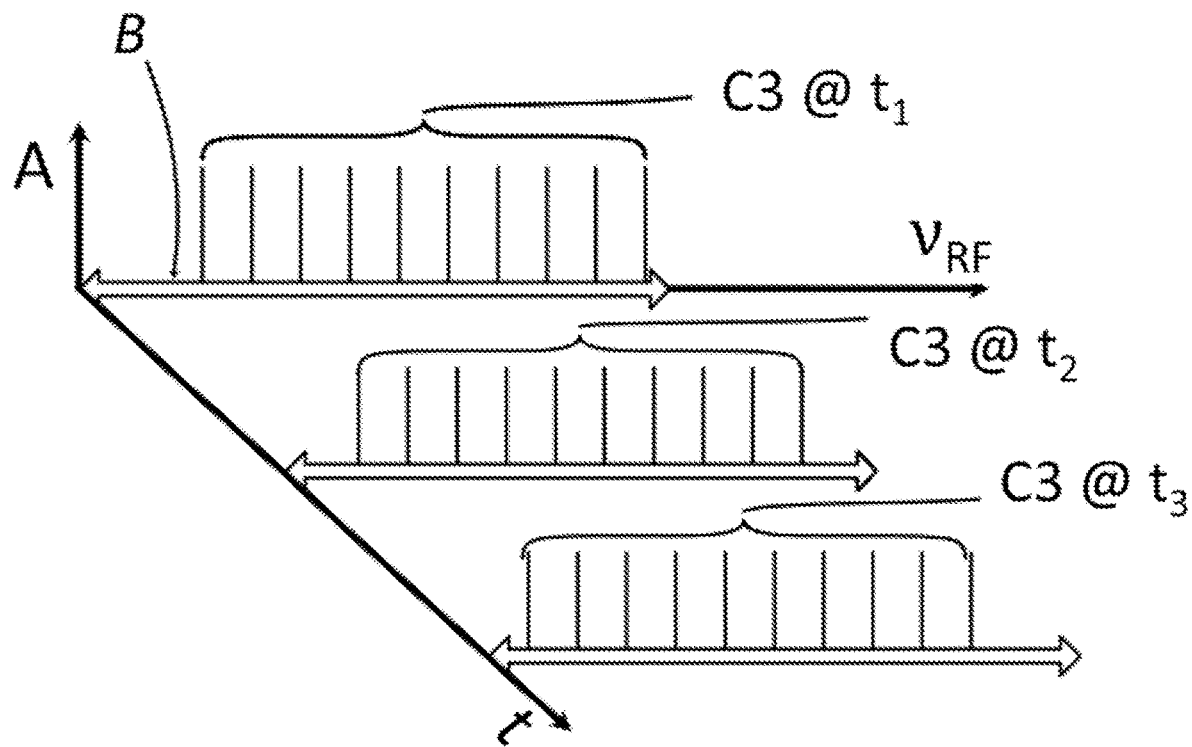
FIG. 8 shows three schematic graphs of amplitude, A, versus RF frequency, $v_{RF}$, for the third frequency comb C3 at the times t1, t2 and t3 of FIG. 7, where the third frequency comb C3 stays within the bandwidth of the detector over the entire scan.

FIGS. 6 to 8 schematically illustrate an example of tuning combs C1 and C2 over >1 FSR while keeping C3 (and C3') within the available bandwidth of the sample detector 30 and, if present, also the normalizing detector 32. In the following discussion, we only refer to combs C2 and C3 (not combs C2' and C3'), since the considerations for coordinating the ramps are the same whether or not the sample is traversed.

FIG. 6 is a graph of current, I, versus time, t, showing two current ramps with functional forms $I_1(t)$ and $I_2(t)$ for driving the first and second laser sources respectively to perform a scan. The starting points of the ramps, at time t1 with currents and $I_{11}$ and $I_{21}$, are selected in a way to generate a heterodyne signal C3 that lies within the bandwith of the detectors. The ramps increase the currents monotonically, via an arbitrary intermediate time t2 with drive currents $I_{12}$ and $I_{22}$, and on to the ramp end points at time t3 with currents $I_{13}$ and $I_{23}$.

FIG. 7 shows the corresponding tuning of the two frequency combs C1 and C2 at times t1, t2 and t3 with schematic graphs of amplitude, A, versus optical frequency, $v_{OPT}$. It can be seen that the scan results in both combs C1 and C2 covering somewhat more than one FSR during the tuning, e.g. about 1.1 or 1.2×FSR. By scanning over at least one FSR, the collected spectrum is gapless and so, even if the sample has line features much narrower than the FSR, they will not be missed. In other words, a ≥1×FSR tuning provided by the two ramps enables a reduction of the effective spectral point spacing by a factor equal to the ratio of the FSR of the QCLs, i.e. their native spectral sampling period, to the spectral resolution of the spectrometer. In scans performed with our prototype system, this ratio was around ten thousand leading to a reduction of the spectral sampling period from 9.8 GHz to ca. 1 MHz. This enables one scan, i.e. one coordinated ramping of the two laser drive currents, to collect a full spectrum. This constitutes a very rapid acquisition, since one scan only takes us about 120 ms to perform. To provide gapless coverage it can be beneficial to scan by a little more than one FSR, e.g. 1.1 to 1.3 FSRs, so that there is a sizeable overlap between signal fragments collected from each neighboring comb tooth pair. In some cases, it may be beneficial to scan over several FSRs, since this allows averaging out of uneven signal-to-noise ratios (SNR) from different scans, since SNR depends on signal strength of individual beat-notes. In other cases, it may not be of interest to have a gapless, continuous scan of the full spectrum, for example when the purpose of the scan is only to establish the presence or absence of a particular molecular species. If a particular molecule is being targeted, then the scan range can be tailored to scan over where the strongest resonances for that molecule lie. It is noted that a molecular resonance, at least for a small molecule, is likely to have a bandwidth several orders of magnitude smaller than the FSR. In such cases, it may be sufficient to scan over a small fraction of the FSR targeted on the molecule being sensed, e.g. as little as 0.1 or 0.2 of the FSR.

FIG. 8 shows the frequency range drift of the third frequency comb C3 during a scan where the coordinated ramping of the two laser drive currents keeps the third frequency comb C3 within the bandwidth of the detector over the entire scan. In its upper part, FIG. 8 shows the RF range of the third comb C3 at time t1, and in its middle part at time t2, and in its lower part at time t3. It can be seen that at time t1 the highest frequency tooth of comb C3 is close to the upper end of the detector bandwidth, B, i.e. the highest frequency that the detector is able to detect (or should be used to detect in order to stay within a linear response range). As shown in FIG. 6, the two current ramps increase monotonically from t1 to t3, i.e. during the scan. In other embodiments, they could be a pair of monotonically decreasing ramps.

A naive, uncoordinated ramping of the two laser drive currents would cause the frequency comb C3 quickly to drift out of the detector bandwidth as a consequence of the first and second lasers exhibiting different tuning properties. It is therefore important to make sure that the increases in drive currents of the two ramps, i.e. the functional forms of $I_1(t)$ and $I_2(t)$, are coordinated with one another in such a way that the frequency comb C3 stays within the detector bandwidth throughout the scan from times t1 to t3. In the example graphs of FIG. 8, the third frequency comb C3 drifts to lower RF frequencies during the scan from t1 to t3, so by the end of the scan, i.e. at time t3, the lowest frequency tooth of comb C3 is close to the lower end of the detector bandwidth.

Coordination of the two ramps can be achieved by looking at the frequency span of the heterodyne signal C3 at the drive currents for times t1 and t3 and optionally also if needed for intermediate times such as t2. Coordinating the two ramps can be effected by adjusting one or both of the ramps in any of the following ways singly or in combination: changing the current at the ramp starting position; changing the current at the ramp ending position; changing the slope of the ramp; changing the functional form of the ramp, e.g. from linear to a more complex non-linear functional form, such as the curve schematically illustrated for the second laser source in FIG. 6. In practice, a convenient approach is only to make fine adjustments to one of the ramps, while the other ramp is kept unchanged. The ramp that is kept unchanged can have a simple linear form.

One approach for making the fine adjustment is to do this with a point-by-point calibration before starting to perform scans. The calibration proceeds by finding individual pairs of drive currents that are matched to each other and then interpolates these to determine a suitable pair of drive current ramps that can be applied to perform a scan. The calibration may start by applying a relatively low, constant drive current to one of the two lasers, say the first laser, where the magnitude is selected to be appropriate for the start of the ramp. The same drive current is then applied to the other laser, say the second laser. If the heterodyne signal (third frequency comb) is not detected, or not all of its teeth are detected, then the second laser's drive current is increased (or decreased) to bring the heterodyne signal fully into the detector bandwidth. The calibration may then continue by applying a relatively high drive current to the first laser, where the magnitude is selected to be appropriate for the end of the ramp, and then adjusting the second laser's drive current to bring the heterodyne signal fully into the detector bandwidth. The calibration at this stage has determined two pairs of suitable drive currents for the start and end of each ramp. These can be interpolated linearly to determine two ramps. Further current pairs at intermediate points on these ramps can then determined by interpolation and then applied. Each such further current pair can then be adjusted empirically as necessary so that the heterodyne signal lies within the detector bandwidth. In this way, once a suitable number of current pairs have been determined, two complete ramps can be calculated by interpolation. The two complete ramps can then be applied in a test scan in order to confirm that the heterodyne signal remains within the detector bandwidth for the full duration of the scan, i.e. in order to check that the interpolation from the individual points is satisfactory. The calibration is then complete.

Another calibration approach which may be used instead of the above approach, or more likely after having already applied the above approach is as follows. After basic setup has been achieved by the above approach, the ramping of the drive currents is adjusted during scans based on feedback from measurements of the frequency span of the third comb C3 taken during the scans. This could be done in every scan, or done occasionally, e.g. every nth scan, or done at the time of loading a new sample, or on system start-up. This calibration measurement may be made by following one tooth of the third comb, say its highest or its lowest frequency tooth or an intermediate tooth, or by following two or more of the teeth, for example the lowest and highest frequency teeth. Adjusting the pair of ramps relative to each other might be done during a scan (fast lock) or more slowly by making incremental changes between scans (slow lock), where the terms fast and slow have the same meaning as in the above discussion of master-slave configurations with reference to FIGS. 4 and 5. Ramp determination and coordination can be carried out by a suitable controller such as the control computer 40.

Figure 9:
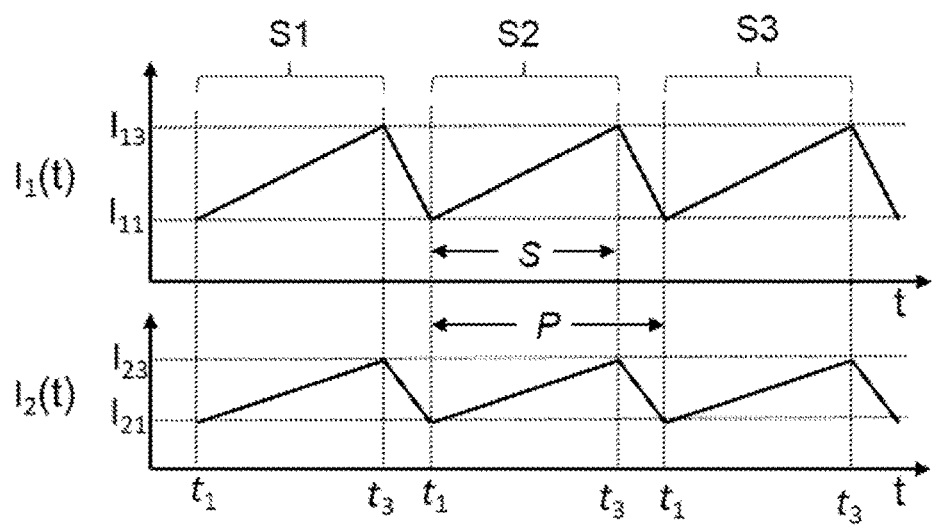
FIG. 9 shows two schematic graphs showing a periodic application of the coordinated pair of drive current ramps of FIG. 6 to perform repeated scans.

FIG. 9 contains two schematic graphs showing periodic application of a coordinated pair of drive current ramps as shown in FIG. 6. The first and second control signals are applied repeatedly to perform repeated scans over successive time intervals during which data is collected. A series of datasets is thus collected which can be averaged to improve the signal-to-noise ratio or combined to show the time evolution of the sample response. The ramps are applied repeatedly as first and second ramp segments of duration S1, S2, S3 etc. using first and second periodic functions with a common periodicity P. The repeated application of the drive currents with the functions $I1(t)$ and $I2(t)$. A scan, S, thus forms a fraction S/P of the period P. The periodic functions can be selected so that the return part of the drive current occurs over a relatively short proportion of the total period, so that S/P—>1 and dead time is kept small (i.e. sawtooth function). An inverted form would also be equivalent, i.e. with data acquisition on a long downslope and rapid return on the upslope. Another option for keeping dead time small, or even zero, is for data to be collected both on the upslope and the downslope, in which case the magnitude of the gradients of the upslope and downslope would beneficially be set to be approximately equal (isosceles triangle function). The functional form of the drive currents will of course be subject to variation from a pure geometric function, e.g. variations due to limitations of the WFG or variations that are deliberately introduced by adding adjustments for any of the reasons discussed elsewhere in this document. An alternative to applying a pair of periodic drive current functions is to collect data in single shots in which the ramp pairs are applied once in response to a single trigger, so as to collect a single dataset from a single scan over the desired fraction of the FSR. Repeated scans may also be collected in this way, each scan being asynchronously triggered, where the trigger may be responsive to some input, such as confirmation that the data from the last scan has been read out or the DAQs have been relatched, or confirmation that the sample is ready for the next measurement. For example, each sample may need to recover from being exposed to a pump laser beam, or the sample may constitute a continuous flow of live cells through a microfluidic channel, so a scan is triggered each time a cell passes through a particular location in the fluid flow passage.

The ramps may not be smooth functions, but rather implemented in steps. Steps may arise simply from the equipment being used, for example a digital WFG may output a drive current that is stepped in time, when looked at with high-enough resolution. The WFG may also be programmed to increment the drive current in steps and dwell a short time at each step, e.g. to provide a fixed number of data points for each scan, e.g. one that is equal to a power of 2 and so matched to a discrete Fourier transform (DFT) processing algorithm such as 256, 512, 1024 etc.

The above discussion of the ramps and how to coordinate them was made in relation to adjusting the laser drive currents. It will be understood that the lasers may also be adjusted by adjusting their temperatures, and temperature adjustment may be used instead of current adjustment, or the lasers may be controlled by a combination of drive current and temperature adjustment. Other adjustment possibilities may also be available based on any parameter that can be varied so as to modulate refractive index or temperature of the sources, e.g. broadband illumination of a part of the source or RF-injection as is now discussed.

Figure 10:
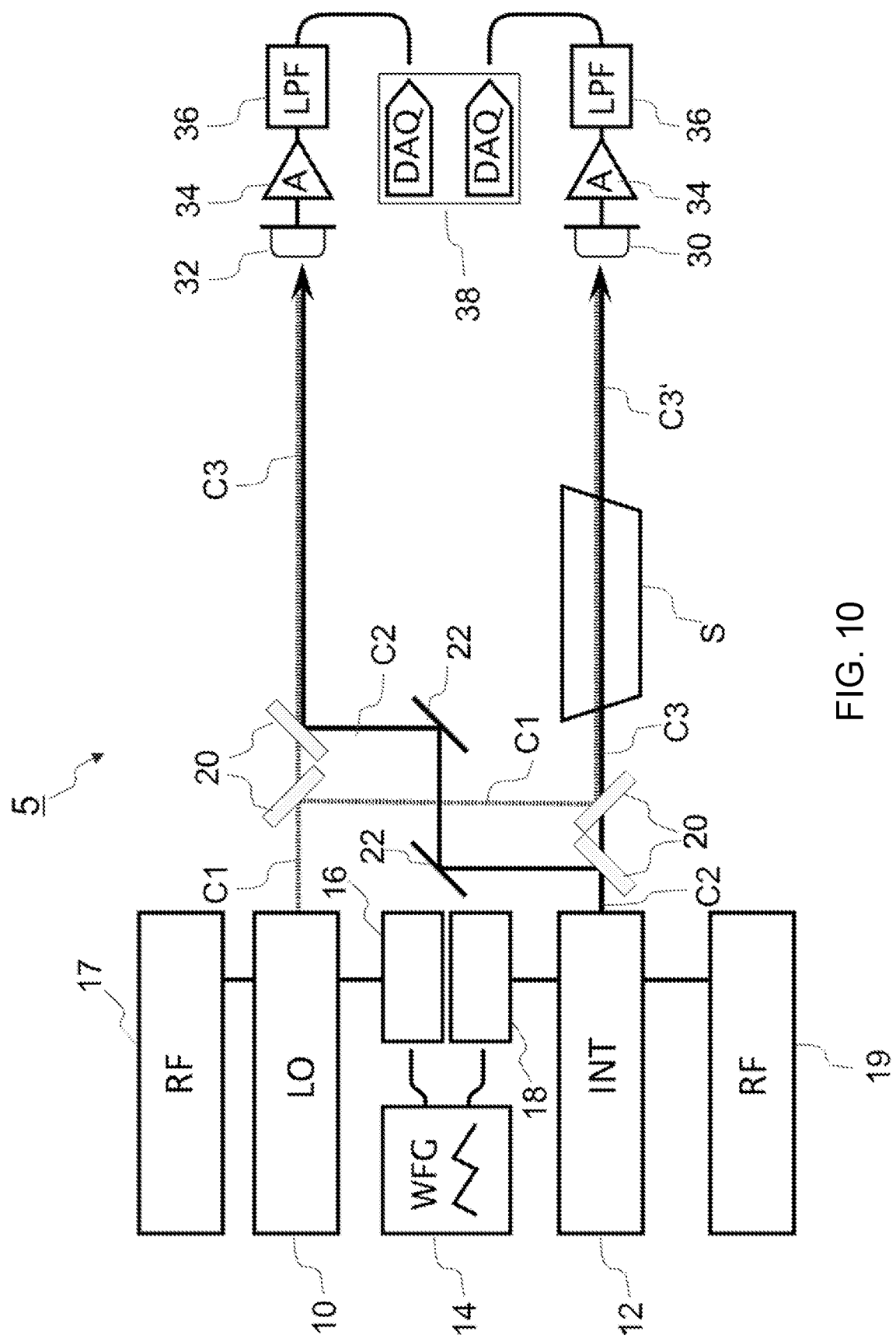
FIG. 10 is a schematic drawing of a dual-comb spectrometer according to another embodiment with RF-injection locking of the lasers to stabilize FSR changes during a scan.

FIG. 10 is a schematic view of another embodiment which has the same sample configuration as FIG. 2, i.e. both the interrogating and local oscillator comb beams C1, C2 are transmitted through the sample. (A variant of FIG. 10 could adopt the sample configuration of FIG. 1, i.e. only the interrogating comb beam is transmitted through the sample S.) In this embodiment there are, compared with FIG. 2, RF-generators 17 and 19 are provided to supply RF-injection currents to the respective laser sources 10 and 12. During a scan of the combs C1 and C2 by drive current as described above with reference to FIGS. 6 to 8, the frequency combs C1 and C2 are tuned. It is an inherent property of a semiconductor QCL (and also an interband cascade laser) that the FSR changes as the frequency comb is tuned which will cause a corresponding change in the frequency spacing of the RF frequency comb C3 over a scan, which can complicate data processing or even in extreme cases compromise data acquisition. To avoid these effects, the FSRs of the frequency combs C1 and C2 generated by the laser sources 10 and 12 can be locked to a particular reference RF frequency by applying an RF signal with a frequency that is equal to, or near equal to, the FSR (i.e. round-trip frequency) of the laser source. The laser's FSR will then lock to the reference RF frequency as long as the reference RF frequency is within the locking range of the laser. The reference frequency is therefore ~1 FSR (or any harmonic of said frequency). A suitable RF-generator for this task is any general purpose RF generator that can operate at the frequencies of the FSRs which it is desired to lock, such as a Rhode & Schwartz SMF 100A. The reference RF signal is preferably injected into both ends of the laser cavity with appropriate phase for enhanced RF-injection, but in some embodiments could be injected into only one end of the laser cavity.

Methods to use on setup in order to find suitable RF-injection frequencies for injecting locking the two lasers over the full scan range are now described.

Figure 11:
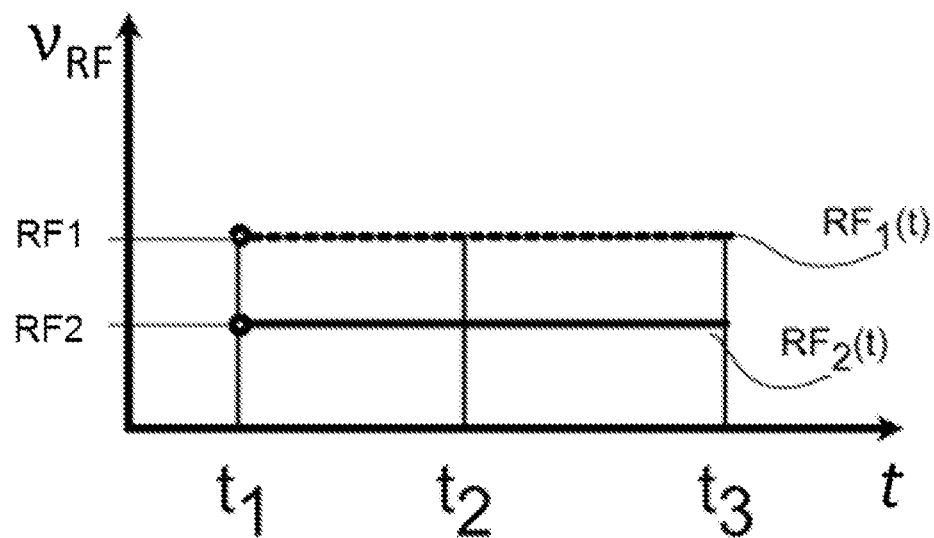
FIGS. 11 and 12 schematically illustrates RF-injection frequencies applied during a scan according to two different modes of use of the dual-comb spectrometer of FIG. 10.

FIG. 11 is a graph of RF frequency, $v_{RF}$, versus time, t, which schematically illustrates the most simple situation for the RF-injection frequencies during a tuning of combs C1 and C2 over >1 FSR, i.e. the tuning illustrated in FIGS. 6 to 8, as performed using a spectrometer according to FIG. 10. In this simple situation, injection locking over the full scan range can be achieved with a single RF-injection frequency for each laser. Namely, the RF-injection frequency function for the first laser, RF1($t$), and for the second laser, RF2($t$), can both be constants with respective values RF1 and RF2. That is, in this simple situation, it is possible to maintain a constant FSR for each laser across the whole scan by applying a single, invariant RF-injection frequency to each laser.

A setup method to find the two RF-injection frequencies RF1 and RF2 is as follows. First, the functional forms of the injection currents for the two lasers, I1($t$) and I2($t$), over a scan period are determined, i.e. the functions shown in FIG. 6. Then, an RF-injection frequency is looked for which can be used for the entire scan period from t1 to t3, i.e. the entire data acquisition phase. The first laser is set at I1($t$1) and an RF-injection frequency is found in the high or low part of the injection frequency locking range. A way to check if the laser is injection locked at any particular operating point is through a directional coupler, a bias-tee or optically on a suitably fast detector, such as a quantum well infrared photodetector (QWIP) or a mercury cadmium telluride (MCT) detector. Next, the laser is set at I1($t$3) and it is checked whether the laser is still injection locked to the RF frequency. It is also possible to check additionally during the scan at any intermediate time point such as I1($t$2). A suitable injection frequency is one which provides injection locking both at I1($t$1) and I1($t$3), which should mean that the injection locking will also be maintained at intermediate currents during the scan. The same RF-injection frequency should also work for the second laser, but this can be checked. Alternatively, the RF-injection frequency for the second laser could be established using the same procedure as described for the first laser.

Figure 12:
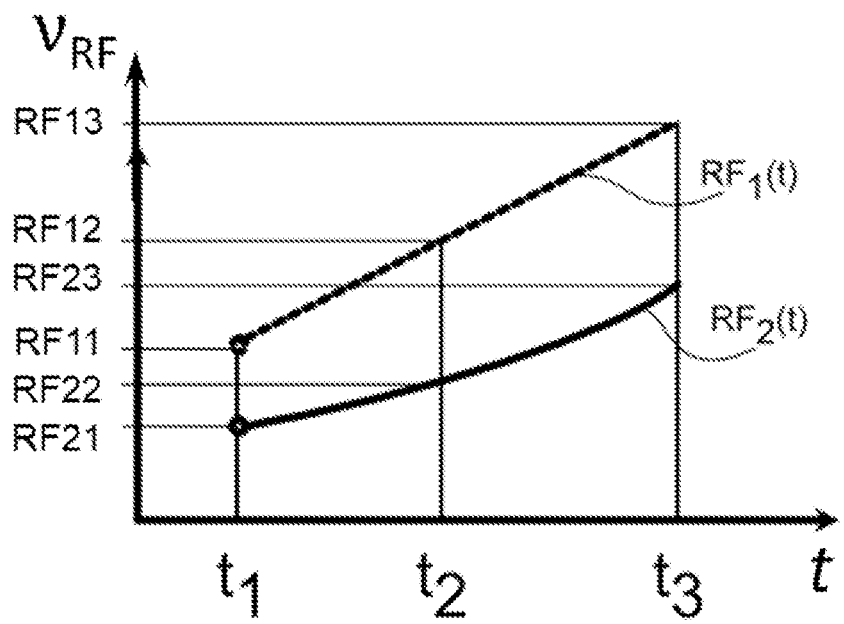

FIG. 12 is a graph of RF frequency, $v_{RF}$, versus time, t, for explaining an alternative setup method for finding suitable RF-injection frequencies, which can be used when it is not possible to find a single RF-injection frequency which locks a laser over the entire scan. This will be the case if the locking range of the laser is too small. Referring to the first laser, the first stage is to find an RF-injection frequency which injection locks the laser when the laser is being driven at the drive current I1($t$1). This injection frequency should be chosen to be close to the ideal RF-injection frequency for this operating point of the laser, i.e. midway in the range of frequencies where there is injection locking at this operating point of the laser (not the high or low part as in the method of FIG. 11). This RF-injection frequency is to be used as a starting RF-frequency, RF11, to apply at the start of a scan at time t1. Then, the laser is tuned to the laser drive current I1($t$3) and another RF-injection frequency is found, RF13, which injection locks at this operating point, corresponding to the end of the scan at time t3. This should also preferably be at the middle of the injection locking range at this operating point of the laser. A function is then defined for the first laser which can be applied to tune the RF-injection frequency from RF11 to RF13 from times t1 to t3. A linear function will in most cases be adequate based on the two RF-injection frequencies found for the operating points at I1($t$1) and I1($t$3). However, if desired, additional operating points between I1($t$1) and I1($t$3) could be sampled during the setup which could enable higher order interpolation to determine the function. This might be necessary, if the drive current functional form during a scan, i.e. what is shown in FIG. 6, deviates significantly from a linear form. The RF-injection frequency function for the second laser can then be established using the same procedure as described for the first laser. During a scan, the RF-injection frequency applied to the first and second lasers will then be tuned using these respective functions (as shown in the upper and lower traces of FIG. 12) at the same time as the drive current is tuned (as shown in the upper and lower traces of FIG. 6).

A hybrid option combining elements of the approaches described with reference to FIGS. 11 and 12 is to apply a limited number of different RF-injection frequencies during a scan. Namely, during a scan, the RF-injection frequency is initially held constant for a fraction of the scan, and then incremented to another value which is held constant for a further fraction of the scan and so forth.

A specific data acquisition is now described.

To demonstrate our prototype spectrometer, we acquired data from a sample of gaseous methane $CH_4$ contained in a gas cell of length 14 cm, the gas cell having uncoated, angled $CaF_2$ end windows. The pressure was 107 mbar. Each spectrum contained approximately 6 million points with a spectral point spacing of about 300 kHz giving a resolution of 0.001 cm-1.

Figure 13:
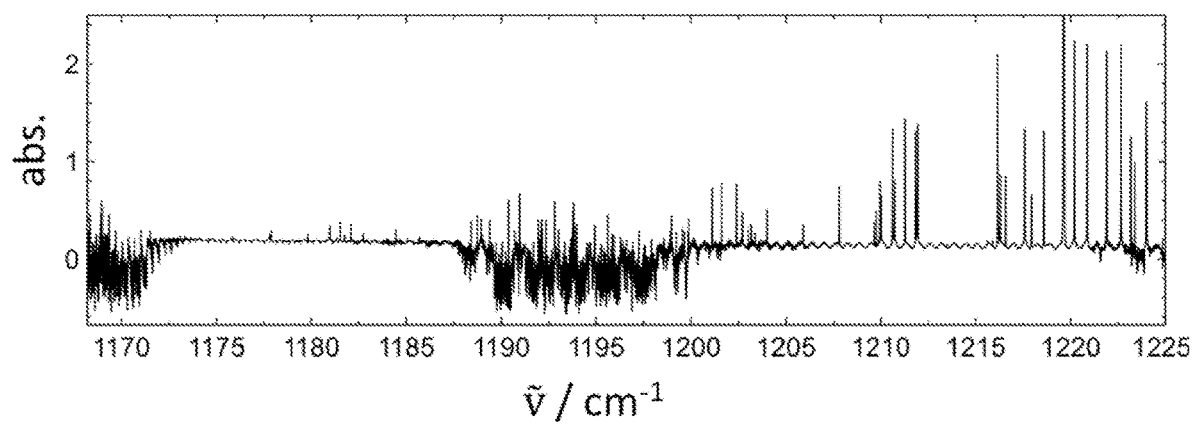
FIG. 13 is a graph showing normalized sample absorbance as a function of wavelength for a single acquisition scan for a methane sample.

FIG. 13 is a graph showing normalized sample absorbance, abs., as a function of wavelength in wavenumbers, $\tilde{v}$, for a single scan.

Figure 14:
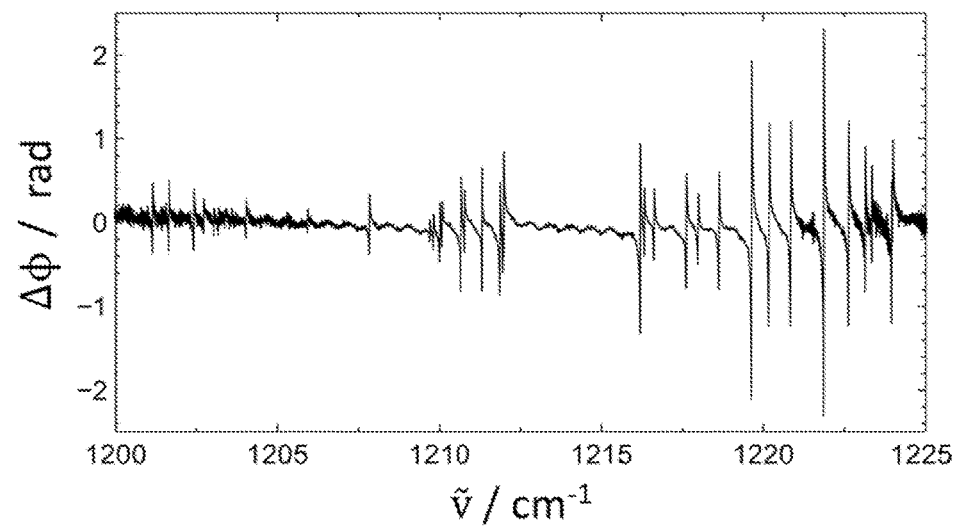
FIG. 14 is a graph showing normalized sample-induced phase shift, i.e. dispersion, over a portion of the wavelength range of FIG. 13.

FIG. 14 is a graph showing normalized sample-induced phase shift $\Delta\phi$, i.e. dispersion, over a portion of the wavelength range of FIG. 13, wavelength being shown in wavenumbers, $\tilde{v}$. Although the graphs show results from a single scan, to improve the signal-to-noise ratio the scan was repeated 22 times and the 22 data sets averaged.

The current for the interrogating (local oscillator) comb is modulated with an asymmetric triangular waveform as follows: slope of +80 mA/120 ms (+62 mA/120 ms) for 120 ms starting from 1.117 A (1.108 A) and ending at 1.197 A (1.170 A), followed by slope of −80 mA/120 ms (−62 mA/120 ms) for 800 ms ending back at 1.117 A (1.108 A) after 920 ms from the start. Both waveforms are set to start on a trigger pulse which also starts the acquisition. On each trigger pulse, $2^{28}$ data points per channel are acquired at 2 GSa/s and saved to disk to be processed later. Two series of scans are measured. In the first series, the sample cell is absent from the laser beam path (background measurement), and in the second series the sample cell is present in the laser beam path (sample measurement).

Due to the limited mutual coherence of the two free-running QCL frequency combs, the beat note amplitudes were measured within a relatively short time to avoid them being "smeared" over a large frequency range. The acquired data ($2^{28}$ samples per channel at 2 GSa/s, 134.2 ms duration) is thus divided into slices of $2^{15}$ samples ($\tau$=16.4 μs). The overlap between consecutive slices is chosen to be 75%, so that the first slice spans $0 \le t < \tau$, the second slice $\tau/4 \le t < 5\tau/4$, the third slice $2\tau/4 \le t < 6\tau/4$, etc. After apodization with a flat-top function, a fast Fourier transform (FFT) is computed for each slice. The transfer function for the entire detection signal chain (detectors, amplifiers, coaxial cables, DAQs) is estimated from a noise measurement at the beginning of each measurement series and is used to correct the FFTs of the slices. This correction has the effect of flattening the magnitude and phase response of the detection signal chain, and to set the average detection noise power spectral density to unity. Most of the Fourier coefficients—those lying between the beat notes—do not contain any useful information and are discarded. Only the coefficients corresponding to the maxima of the beat notes are retained. Apart from a normalization factor, spectral leakage, and additive detector noise, these Fourier coefficients are the beat note amplitudes. For the sample (S) and normalizing (N) photodetector we label the amplitudes as $S_{js}$, $N_{js}$, where j is the beat note index, and s is the slice index. The thus-defined beat note amplitudes are very sensitive to fluctuations in the frequencies of the beat note, which tend to distribute the beat note power over some frequency range, as well as to the aforementioned spectral leakage. Both issues are minimized by taking the beat note amplitude ratio, $R_{js}=S_{js}/N_{js}$, which was found to be virtually immune to these types of fluctuations, since they affect both measurements, $S_{js}$, $N_{js}$, in the same way.

In the first data slice ($0 \le t = \tau$), all the beat notes are identified and numbered. This numbering must be kept consistent throughout all of the following slices, so that the absorption (change in magnitude of the beat notes) and refractive index (change in phase of the beat notes) are assigned to the correct optical frequencies. When the laser drive currents are modulated, large frequency offsets as well as breathing of the beat note pattern are unavoidable. These are caused by the slightly different tuning properties of the two QCL frequency combs. For each slice, the spacing of the beat note pattern is determined from the auto-correlation function of the power spectral density (PSD) for that slice. The frequency offset of the pattern, on the other hand, is computed either from the cross-correlation of the PSD of that slice with that of an earlier one, or by simply assuming that the frequency offset from the previous slice to the current one is less than half the spacing of the beat note pattern (i.e. each beat note remains in the neighborhood of where it was in the previous slice). Which technique is chosen for any given slice depends, among other things, on the quality of the PSD (e.g. if there are multiple periodic patterns), and on the change of the PSD spacing relative to the previous slice (e.g. if there is a larger-than-normal increase or decrease).

The absorption and dispersion data are organized in two matrices, $\mathcal{A}$, $\mathcal{D}$, where the row index, j, corresponds to the beat note index (comb line index) and the column index, s, corresponds to the slice (time) index. Each row thus represents the absorption or dispersion probed by one line of the interrogating comb. In order to plot all the rows on a common frequency axis, we compute, for each row, a calibration curve, i.e. a relationship between slice index and optical frequency. For this, we can exploit the comb property of the laser source as follows. The frequency of the interrogating comb line with index j in slice s can be written as $v_{js}=v_{j_0 s}+(j-j_0)\cdot\Delta v_s$, where $v_{j_0 s}$ is the frequency in slice s of an arbitrarily chosen comb line with index $j_0$, and $\Delta v_s$ is the FSR of the interrogating comb in slice s. Then, the entry, $\mathcal{A}_{js}$, in $\mathcal{A}$ is the absorption of the sample at the optical frequency $v_{js}$, and similarly for the dispersion. We assume that with the applied current ramp, $v_{j_0 s}$ and $\Delta v_s$ both change quadratically with s (i.e. with time), $$v_{js}=(a_0+a_1 s+a_2 s^2)+(j-j_0)\cdot(b_0+b_1 s+b_2 s^2)$$

where
$a_0$ is the frequency of comb line $j_0$ in slice s=0 (i.e. at t=0),
$a_1$ is the tuning slope for comb line $j_0$, and
$b_0$ is the FSR of the interrogating comb in slice s=0.

The values of the six polynomial coefficients are determined by identifying 22 methane lines in the measured spectrum. Then, for each absorption line, l, we have three quantities: the frequency, $P_l$, of the absorption line (from HITRAN); the comb line index, $j_l$, of the comb line that probed the absorption line l; and the slice index, $s_l$, at which said comb line was at the centre of the absorption line. We then determine the best values, in the least-square sense, of the six polynomial coefficients by minimizing the sum of residuals squared, $\Sigma_i(\hat{v}_i \nu \nu_{j_i^{s_i}})^2$, with Matlab's nlinfit procedure. In order to have good initial guesses for $a_0$ and $a_1$, for $j_0$ we choose a line that scans over at least two methane absorption lines. The starting value for $b_0$ is estimated by taking two methane lines probed by two different comb lines, $j_1, j_2$, and dividing the frequency difference, $\Delta\hat{v}$, by the comb line index difference, $b_0 \approx \Delta\hat{v}/|j_1 - j_2|$. The remaining fit parameters were set to zero and the fit converged.

It will be clear to one skilled in the art that many improvements and modifications can be made to the foregoing exemplary embodiment without departing from the scope of the present disclosure.

REFERENCE NUMERALS 5 dual-comb spectrometer
10 first laser source (local oscillator)
12 second laser source (interrogator)
14 waveform generator (WFG)
16 first laser source driver
17 RF-generator for first laser
18 second laser source driver
19 RF-generator for second laser
20 beam splitters
22 mirrors
30 sample photodetector
32 normalizing photodetector
34 amplifiers (A)
36 low-pass filters (LPFs)
38 digital to analogue converters (DAQs)
40 control computer/data logger
42 frequency demodulator
44 PID controller
S sample
C1 first frequency comb (local oscillator)
C2 second frequency comb (interrogator)
C3 third frequency comb (mixed first and second)

The invention claimed is:

1. A dual-comb spectrometer comprising:
    a first semiconductor laser source, serving as a local oscillator, operable to output a first light signal containing a first frequency comb consisting of a finite series of discrete frequencies separated by a first spacing defined as a first spectral range;
    a second semiconductor laser source, serving as an interrogator, operable to output a second light signal containing a second frequency comb consisting of a finite series of discrete frequencies separated by a second spacing defined as a second spectral range;
    a sample detector operable to output a measurement signal and arranged to receive a combined light signal from superimposing the first and second light signals after at least the second light signal has traversed a sample space, the sample detector having a detection bandwidth that covers a frequency range corresponding to a third frequency comb that is detected by the sample detector as the measurement signal as a result of heterodyne mixing of the first and second light signals, the third frequency comb having a third spacing equal to the difference between the first and second spacings;
    a controller configured to output first and second control signals to the first and second laser sources, the first and second control signals following first and second functional forms over each of one or more scan periods, wherein the first and second functional forms are defined as a coordinated pair to perform a coordinated joint tuning of the frequencies of the first and second frequency combs over a defined fraction of their free spectral ranges while keeping the frequency range of the third frequency comb within the bandwidth of the sample detector; and
    a data acquisition module arranged to collect a dataset of data points from the sample detector over each scan period, the dataset of each scan period being collected while the first and second control signals are following the first and second functional forms.

2. The spectrometer of claim 1, wherein the controller is configured to receive an RF signal indicative of a frequency of at least one tooth of the third frequency comb, wherein at least one of the first and second control signals is adjusted in a feedback loop responsive to the RF signal to ensure the frequency range of the third frequency comb is kept within the bandwidth of the sample detector during the scan period.

3. The spectrometer of claim 2, wherein the feedback loop is controlled so as to hold the frequency range of the third frequency comb constant.

4. The spectrometer of claim 1, wherein the controller is configured to apply the first and second functional forms periodically to collect multiple ones of the datasets.

5. The spectrometer of claim 1, wherein the controller is configured to apply the first and second functional forms asynchronously responsive to repeated input of a trigger to collect multiple ones of the datasets.

6. The spectrometer of claim 1, wherein the defined fraction of the free spectral range is less than one.

7. The spectrometer of claim 1, wherein the defined fraction of the free spectral range is at least one.

8. The spectrometer of claim 1, wherein the first and second control signals are voltage signals that are input to first and second current drivers, which translate the first and second control signals into a modulation of a first and second drive currents applied to the first and second laser sources.

9. The spectrometer of claim 1, further comprising a frequency demodulator arranged to extract an error signal from the measurement signal, the error signal being fed back to the controller, the controller being configured to determine a correction signal from the error signal in a control loop to at least one of the first and second laser sources derived from the error signal so as to lock the first laser source to the second laser source in a master-slave configuration.

10. The spectrometer of claim 9, wherein the controller is connected to apply the correction signal as a modulation to the first and second functional forms it uses to generate the first and second control signals.

11. The spectrometer of claim 9, wherein the controller is connected to apply the correction signal as a modulation to the first and second control signals.

12. The spectrometer of claim 1, further comprising a first RF generator operable to generate a first reference signal at a first RF frequency that is matched to the first free spectral range, the first RF generator being connected to inject the first reference signal into the cavity of the first laser source to lock the first free spectral range to the first RF frequency.

13. A method of operating a dual-comb spectrometer comprising:
    arranging a sample in a sample space;
    outputting with a first semiconductor laser source, serving as a local oscillator, a first light signal containing a first frequency comb consisting of a finite series of discrete frequencies separated by a first spacing defined as a first spectral range;

outputting with a second semiconductor laser source, serving as an interrogator, operable to a second light signal containing a second frequency comb consisting of a finite series of discrete frequencies separated by a second spacing defined as a second spectral range;

measuring with a sample detector a measurement signal from a combined light signal formed from superimposing the first and second light signals after at least the second light signal has traversed the sample space, the sample detector having a detection bandwidth that covers a frequency range corresponding to a third frequency comb that is detected by the sample detector as the measurement signal as a result of heterodyne mixing of the first and second light signals, the third frequency comb having a third spacing equal to the difference between the first and second spacings;

applying first and second control signals to the first and second laser sources with a controller, the first and second control signals following first and second functional forms over each scan period, wherein the first and second functional forms are defined as a coordinated pair to perform a coordinated joint tuning of the frequencies of the first and second frequency combs over a defined fraction of their free spectral ranges while keeping the frequency range of the third frequency comb within the bandwidth of the sample detector; and collecting a dataset of data points from the sample detector over each scan period with a data acquisition module, the dataset of each scan period being collected while the first and second control signals are following the first and second functional forms.

* * * * *